United States Patent [19]
Schmidt et al.

[11] Patent Number: 5,436,062
[45] Date of Patent: Jul. 25, 1995

[54] PROCESS FOR THE PRODUCTION OF PRINTED CIRCUIT BOARDS WITH EXTREMELY DENSE WIRING USING A METAL-CLAD LAMINATE

[75] Inventors: Walter Schmidt, Zürich; Marco Martinelli, Neftenbach, both of Switzerland

[73] Assignee: Dyconex Patente AG, Zug, Switzerland

[21] Appl. No.: 193,191
[22] PCT Filed: Jun. 9, 1993
[86] PCT No.: PCT/CH93/00145
§ 371 Date: Feb. 14, 1994
§ 102(e) Date: Feb. 14, 1994
[87] PCT Pub. No.: WO93/26143
PCT Pub. Date: Dec. 23, 1993

[30] Foreign Application Priority Data

Jun. 15, 1992 [CH] Switzerland ................ 01872/92
Jun. 15, 1992 [CH] Switzerland ................ 01878192
Jun. 15, 1992 [GB] United Kingdom ........ 9212648
Apr. 1, 1993 [CH] Switzerland ................ 01017/93
Apr. 6, 1993 [CH] Switzerland ................ 01050/93
Jun. 2, 1993 [CH] Switzerland ................ 01639/93

[51] Int. Cl.⁶ .......................... B44C 1/22; C23F 1/02; B32B 3/00
[52] U.S. Cl. ................... 428/209; 216/18; 216/20; 216/67; 174/254; 174/266; 428/901
[58] Field of Search .......... 156/634, 643, 644, 645, 156/655, 656, 659.1, 901, 902, 630, 633; 29/846, 852; 427/97; 174/250, 254, 255, 266, 268; 428/156, 209, 901

[56] References Cited

U.S. PATENT DOCUMENTS

| | | | |
|---|---|---|---|
| 3,820,994 | 6/1974 | Lindberg et al. | 156/644 |
| 4,118,523 | 10/1978 | Bingham et al. | 427/97 |
| 4,668,332 | 5/1987 | Ohnuki et al. | 156/630 |
| 4,830,691 | 5/1989 | Kida et al. | 156/631 |
| 5,232,548 | 8/1993 | Ehrenberg et al. | 156/630 |

FOREIGN PATENT DOCUMENTS

| | | |
|---|---|---|
| 0154909 | 9/1985 | European Pat. Off. |
| 0275686 | 7/1988 | European Pat. Off. |
| 0283546 | 9/1988 | European Pat. Off. |
| 0451541 | 10/1991 | European Pat. Off. |
| 1574301 | 7/1969 | France |
| 2117172 | 7/1972 | France |
| 2034527 | 6/1980 | United Kingdom |
| 2163007 | 2/1986 | United Kingdom |

OTHER PUBLICATIONS

Patent Abstracts of Japan, vol. 13, No. 407 (E-818), 8 Sep. 1989 referring to Japanese patent publication 1,147,887 (Showa Electric Wire & Cable Company) of 9 Jun. 1989.

Patent Abstracts of Japan, vol. 13, No. 407 (E-818), 8 Sep. 1989 referring to Japanese patent publication 1,147,891 (Showa Electric Wire & Cable Company) of 9 Jun. 1989.

*Primary Examiner*—William Powell
*Attorney, Agent, or Firm*—Walter C. Farley

[57] ABSTRACT

In a metal-clad laminate the requirements concerning the mechanical strength are functionally separated from the circuit connection requirement, so as to be able to bring the circuit connection, particularly for signals, "closer" to the electrotechnical characteristics of the chips. For this purpose and without taking account of the mechanical strength of the substrate, the layout miniaturization is optimized. In place of a circuit board (MCM), a laminate which can be built up to a circuit board is produced. The inventive laminate comprises an extremely thin foil with a plurality of extremely small holes simultaneously etched in an etching process. The hole diameter can be reduced by almost an order of magnitude (up to 20 μm), which permits a sub-100 μm technology. Such a laminate is not used as a mechanical support and is only provided for signal guidance. The effect of the miniaturization can be seen in the diameter for the plated-through holes. With a hole diameter reduction there is an increase in the current path density, which gives over 10000 plated-through holes per dm². A drawing shows the compression ratio compared with standard technology.

13 Claims, 13 Drawing Sheets

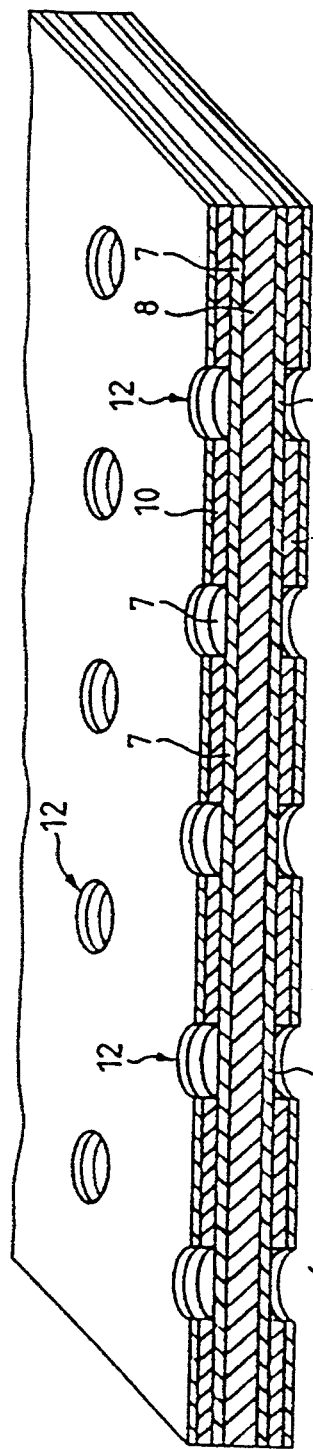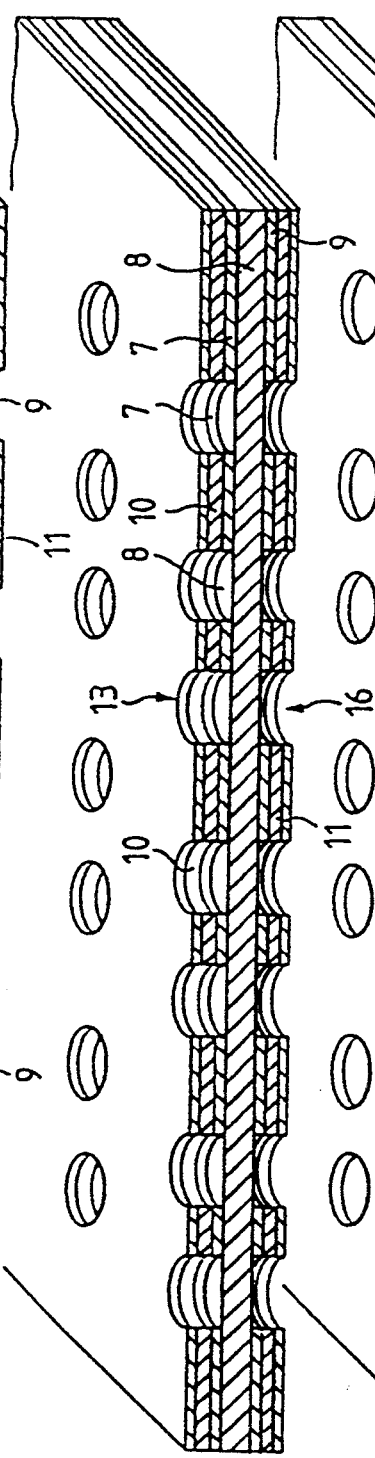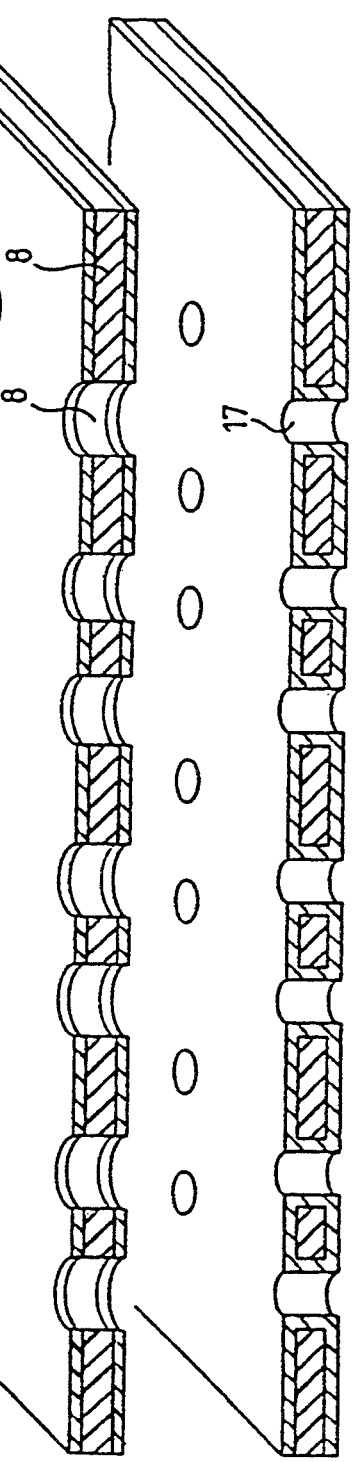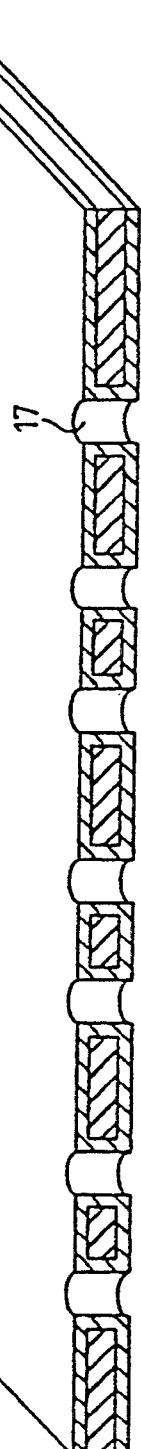

PROCESS FOR THE PRODUCTION OF PRINTED CIRCUIT BOARDS WITH EXTREMELY DENSE WIRING USING A METAL-CLAD LAMINATE

FIELD OF THE INVENTION

The invention relates to the field of manufacture of printed circuit boards and relates to a process for the production of a metal-clad laminate for use in circuit board manufacture, as well as to a roll-to-roll process for the production of circuit boards using metal-clad laminates.

BACKGROUND OF THE INVENTION

Since the early days of electrotechnics, printed circuit boards have been in the form of standard singlelayer or multilayer "printed" circuits formed from a combination of flat current parts (connections of the electronic circuit) and an insulating plate (the electrically insulating, mechanical support). The structuring of the circuit (layout) takes place by photochemical processes. Apart from surface-mounted devices or SMD technology, the circuit boards have passages, which are used on the one hand for the through-assembly (electrical contacting and mechanical fixing) of simple electronic components (such as resistors, capacitors, coils, etc.) and on the other hand are used to electrically connect current paths of different layers of a circuit board by means of plated-through holes.

However, the development of more complex circuits has taken place on the plane of integrated circuits (IC's), which comprise a plurality of electronic elements (transistors) on a common substrate and which are protected by a casing (chips). These chips have a very high density and ever-increasing compression with respect to circuits, which largely takes place through the miniaturization or reduction of the conductor thicknesses and the conductor spacings in the Si-substrate in a sub-μm range. The casing dimension of such chips remains of the same order of magnitude as the aforementioned simple components, for easy handling reasons, while the dimensions of the circuit board and their holes or plated-through holes has remained largely unchanged. Thus, the miniaturization of circuits has mainly taken place by means of integrated circuits, which are independent, function-linked units, which can be easily inserted on circuit boards.

The structural dimensioning of the printed circuit boards has only incompletely participated in this miniaturization. There has indeed been a certain miniaturization of circuit boards with conventional technology, but this has occurred less through rigorous compression than by the greatest possible narrowing of the conductors.

However, significant advances have been prevented by the unavoidable plated-through holes, which have hitherto been subject to precision improvements, but not to miniaturization. The reason for this is that the circuit board plated-through holes have reached a structurally caused lower limit and cannot undergo further size reductions because, apart from the drill diameter limit, a considerable amount of space is taken up by the soldering pads and the prepared solder surfaces. However, it would be desirable to manufacture substrates (circuit boards) with a ten times greater density, but this is not possible with the gradual miniaturization of standard technology. Such a dimensioning jump leads to conflicts of aims.

Circuit boards, prepregs and conductor films are generally 0.1 to 1 or 2 mm thick and their hole diameter is necessarily 0.2 to 0.5 mm. Such dimensions are consequently 2 to 3 orders of magnitude (100 to 1000 times) above the corresponding dimensions of the conductor thicknesses and spacings in integrated circuits. There is a very significant dimensional variation between circuit boards and IC's.

The reason for the conventional and to some extent archaic construction of circuit boards is that it was not hitherto necessary to make significant innovations in circuit board technology with respect to a downward dimensioning. The presently conventional construction also has a technical basis. In order to be able to support components, the circuit boards must have a certain strength and it has not hitherto been possible to get away from this. Limits are placed on the mechanical drilling for the production of plated-through holes, e.g. with the presently minimum drill diameters of 0.2 mm, while the size and positional accuracy of galvanically through-plated holes are also limited.

This stagnation of conventional manufacturing technology relative to circuit boards, accompanied by a sweeping development relative to integrated components, has unavoidably led to the aforementioned structural problems. Complex chips lead to evermore complicated arrangements on the circuit board. The dimensions of the current paths, holes and plated-through holes have remained unchanged for some time. As a result up to 60-layer circuit boards are used, whose layout causes high expenditure and effort and whose manufacturing costs constantly rise. The miniaturization of complete circuits is made more difficult by the conflict of aims of the chips, which require denser integration, and the circuit boards, which come up against the layout miniaturization limit and are no longer able to meet demands. A way out by increasing the number of layers for multichip modules (MCM) in circuit boards as a result of the compression of the chips leads to excessive manufacturing cost rises compared with the manufacturing costs of the actual chips, which constitute the core of the overall circuit.

Miniaturization is also no longer restricted to the smallest sizes of the conductor spacings in integrated circuits and also applies to electrical and electronic equipment. Small pocket televisions, portable personal computers (laptop), hand cameras and other highly complex equipment necessarily require small circuit boards and conductor foils. It is often necessary to adapt the shape and design of circuit boards to the equipment and flexible conductor foils are particularly suitable for this.

Roll-to-roll processing of foils is possible, which permits a high degree of automation. In addition, the continuous plants used with conventional materials e.g. for developing photoimages, etching, stripping, brushing, etc. are always conveyed with a conveying system (progressive assembly line, clamps), conveying the rigid boards through the machine. In the case of a foil there is no need for such a conveying system, which not only leads to plant cost savings, but also eliminates the conveying system, which often produces defects on the product, such as scratches, pressure points, etc.

In addition, foils do not generate dust, which is a further important advantage. In the case of rigid materials dust is released from the cut edges and this leads to reduced output. As a result of the planeness and smooth surface, the foil can be very easily cleaned. In the rolled up state the foil material surface is also protected against contamination, particularly dust.

Unlike in the case of conventional material, a foil is produced in a continuous process, i.e. the material has constant parameter values along its web. In particular, the shrinkage and/or elongation behavior is constant and can therefore be easily compensated. Unlike in the case of rigid, glass fiber fabric-reinforced material, the foil surface is very flat or smooth and is not surface-modulated by the glass fiber fabric. Thus, in the photochemical transfer of images, particularly during exposure, better production characteristics are achievable. Moreover, as the foil is flexible, it can adapt closely to the photomask, which is also a film, which avoids so-called hollow exposures, which naturally leads to improved output.

Through the use of a foil it is possible to cover both rigid and flexible uses. In addition, rigid, flexible combinations are possible. When using a thin foil the resulting hole diameter is very large compared with the hole length or depth, when said ratio is compared with conventional circuit boards. A 25 $\mu$m thick foil with a relatively small hole of only 80 $\mu$m has a ratio of more than 1:3. This is very advantageous in the case of electrogalvanic feed-through, because the material exchange from the hole to the surrounding electrolyte functions much better than in thin, long holes of a conventional nature in circuit boards, which are very difficult to galvanically feed-through.

With respect to the thermal expansion occurring in the Z-direction no problems are caused by a thin foil. Conventional 1 to 5 mm thick printed circuit boards have in the Z-direction a thermal expansion which must not be underestimated and which can lead to tearing of the galvanic coating introduced into the holes, which represents an electrical defect.

In the case of electronic circuits with a high packing density heat dissipation is also usually a very serious problem. In conventional circuit boards so-called heat sinks are laminated in or laminated onto the surface. They consist of thermally good conducting materials such as copper or aluminium and serve to pass the thermal energy produced by the components as efficiently as possible to the cool points such as e.g. the casing wall. As in conventional technology the circuit board is usually 1 to 5 mm thick, this means that the thermal energy generated by the components must firstly be passed through the circuit board to the cooling plate. As the circuit board primarily consists of a poor heat conductor (plastic, glass), this leads to a high thermal resistance between the heat-producing component and the cooling place. Thus, in many cases it is necessary to provide special plated-through holes (thermal vias) for heat conduction purposes and they take up a considerable amount of expensive space. As a result, in many cases, further conductor layers are necessary, which in turn further increases the circuit board thickness.

When using thin foils even under the most extreme packing and connection densities (conductors), the circuit board is only roughly 0.1 to 0.2 mm thick. Therefore this foil is a comparatively small thermal resistance and therefore improves the thermal management to a significant extent.

If for the construction of the electronic circuit use is made of leadless ceramic chip carriers (LCCC's) or larger ceramic capacitors and other components made from a material with a small thermal expansion coefficient and they are soldered directly to the circuit board without any elastic connection to the substrate (e.g. elastic contact legs), then to obtain a sufficient reliability of the solder points the circuit board would have to undergo a thermal expansion behavior adaptation. Conventionally use is made of rolled metal foils made from copper-invar-copper (CIC) or coppermolybdenum-copper (CMC) with an expansion coefficient of approximately 4 to 6 ppm/°K. Uses are also known with carbon fiber composite materials or aramide fiber composite materials.

In conventional technology the non-reinforced circuit boards are in the range 16 to 18 ppm/°K. and, as the plates are usually between 1 and 5 mm thick, they must be stabilized by a large amount of CIC, CMC, etc. This leads to a significant increase in the total circuit board thickness, which negatively influences the reliability and also makes thermal management more difficult. In addition, such circuit boards become relatively heavy, which is certainly undesired in the avionics field.

However, if foils are used as the base material, the total thickness of a complex circuit board is approximately 0.1 to 0.2 mm. If this foil circuit board is laminated onto a support, which has a low thermal expansion coefficient, then the expansion coefficient of the circuit board surface is almost identical to that of the support plate or board, because the thin foil has no significant influence on the overall structure. The foil is also not reinforced by glass fibers, so that the modulus of elasticity of the foil is much lower than that of glass fiber-reinforced materials and is consequently not negatively influenced by the stabilizing action of the support plate.

If within an electronic circuit use is made of high frequency signals, then an important part is played by the so-called impedance (i.e. wave impedance) of the electric lines. Thus, for avoiding reflections, use is made of lines with a 50 $\Omega$ or higher impedance (standard). Apart from the absolute size of the wave impedance, great importance is attached to constancy over the conductor length for high frequency characteristics. An important part is played by the dielectric thickness constancy. The use of a foil offers much better tolerances with respect to the dielectric constant and the material thickness as compared with conventional base materials.

BRIEF SUMMARY OF THE INVENTION

An object of the present invention is to bring about an optimum, maximum density current path occupancy on printed circuit boards. It is intended to indicate a way in which circuit boards can be manufactured without significant cost increases and with a much higher functional density (the cooperation of components and their connections, increased wiring density, etc.), even in the case of boards having highly complex functions. Known and proven technologies, materials, etc. are to be used, e.g. for the manufacture of the conductor structures it is possible to use known wet chemical processes. These circuit boards are to have a functional density increased by an order of magnitude or more compared with known boards and in spite of this, with respect to further processing and in particular with respect to assembly and use, are compatible with known systems. In addition, the manufacture of circuit boards using such metal-clad laminates must take place automatically, e.g. roll-to-roll, while also permitting a supplying batch operation by e.g. injecting support plates.

The idea of the invention is firstly to functionally separate the mechanical strength from the hitherto linked requirement of circuit connection, in order to be able to bring the circuit connection, particularly for signals, "closer" to the electrotechnical characteristics of the chips. In order to achieve this, the layout miniaturization has been optimized, without taking account of the mechanical strength of the substrate. It is also possible to functionally separate and separately optimize the electric power supply. Unlike in the conventional development of integrated circuits the present invention consequently aims at reducing all the dimensions of the circuit boards, in that the individual functions (signal guidance, feed, mechanical strength) are miniaturized in functionally separated manner, so that in the final process steps they are "synthesized" to a high density circuit board. The rigorous miniaturization of the signal-guiding layout is obtained by a purely chemical procedure avoiding mechanical means. By means of molecules and atoms it is possible to "drill" finer plated-through holes and all can be obtained simultaneously. This overcomes the conflict of aims between the integrated circuits and the circuit boards by means of a dimensioning jump. As a result of the very marked reduction of the thickness and consequently the stiffness of a circuit board, roll-to-roll manufacture is possible. With a thickness increase during which the radius changes by bending during rolling could become critical, there is a folding of the band consisting of circuit boards at specific predetermined breaking points. Such a fold stack as a process buffer can be incorporated into any further "roll processing" and also offers the possibility for a partial batch operation, e.g. for introducing a substrate, stabilizing member, etc.

The process according to the invention is essentially based on the fact that in place of a circuit board, while separating off all the functions not linked with the layout, in a preceding process step a metal-clad laminate which can be built up to a circuit board is produced and this makes it possible to drastically reduce the functional units on circuit boards and achieve a corresponding functional density increase. The metal clad laminate according to the invention comprises an extremely thin foil with extremely small holes. The hole diameter can be reduced by almost an order of magnitude (up to 20 μm), which e.g. permits a sub-100 μm technology. Such a laminate is a stiff, mechanical support and is only provided for signal guidance, the conductors being produced in a subsequent manufacturing step in accordance with the predetermined layout. Conductors for the electric supply are advantageously not located on such a laminate. The effect of the miniaturization becomes particularly apparent in the diameter for the plated-through holes. A hole diameter decrease is quadratically linked with the current path density. As a result of their impedance-favourable construction, such circuit boards also make it possible to transmit high frequency signals (frequency >1 GHz). Even with a two to three times smaller hole diameter only three to four-layer multilayers are required in order to achieve the same circuit complexity as can now be obtained with a 20 or 25-layer circuit boards.

BRIEF DESCRIPTION OF THE DRAWINGS

The invention is described in greater detail hereinafter relative to a non-limitative embodiment and with reference to the attached drawings, wherein:

FIGS. 9a to 9d Diagrammatically and partly in section the arrangement of preconditioned plated-through holes.

DESCRIPTION OF THE PREFERRED EMBODIMENTS

Figure 1:
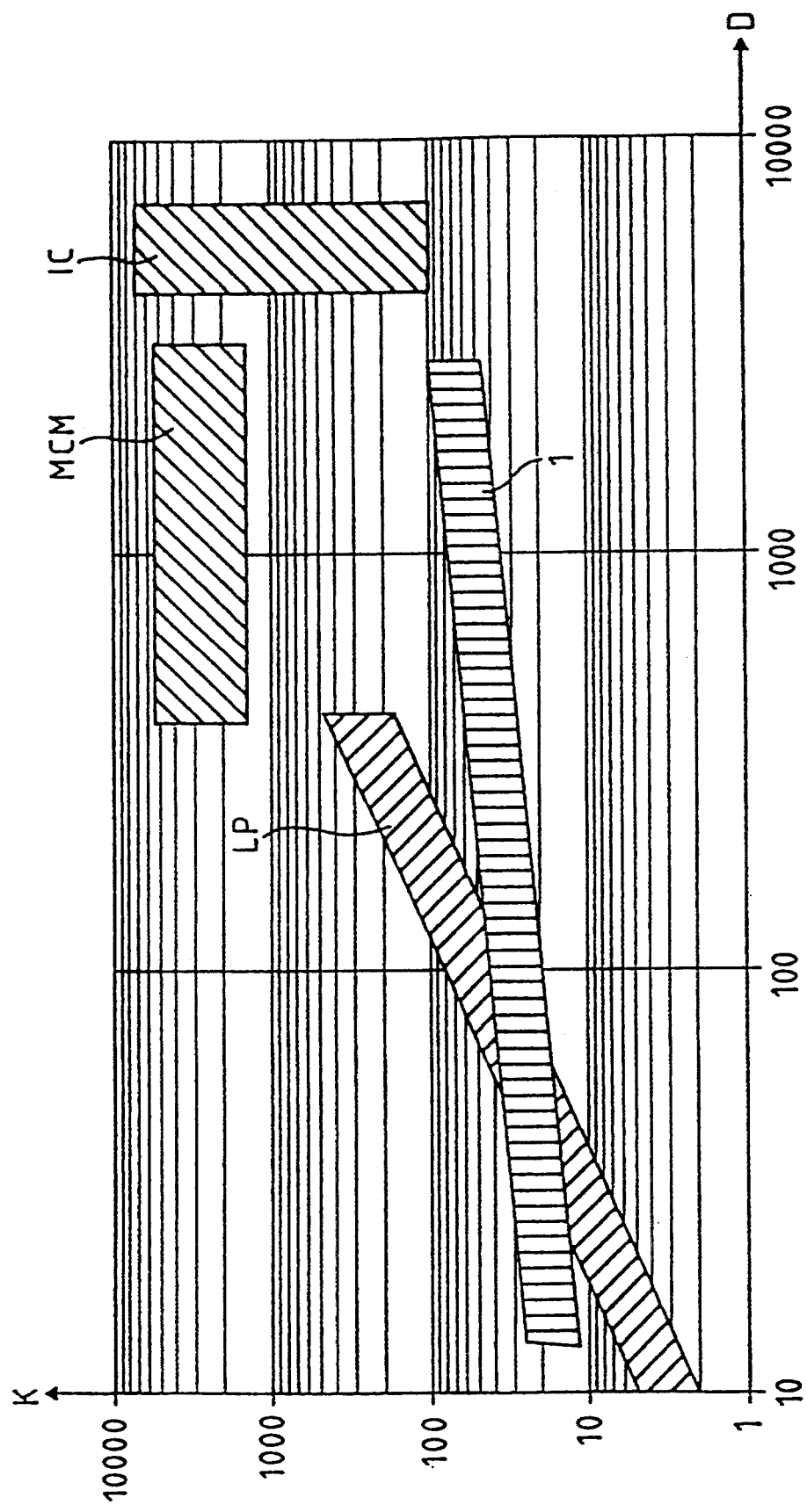
FIG. 1 A diagram showing the connection density of different substrate technologies compared with the resulting surface costs.

FIG. 1 is a diagram showing the connection density of different substrate technologies as compared with the resulting surface or area costs. The cost increase of MCM's in conventional circuit board technology is compared with those according to the invention, which are produced from metal-clad laminates in the manner to be described hereinafter. On the abscissa is plotted the connection density D (the number of connections per unit surface) in random units. As a function of this density D the ordinate gives the approximate relative costs K of the manufacture of a circuit board per surface unit. The left-hand area LP indicates the density D according to the most cost favorable and the less densely packed conventional printed circuit board or PCV technology, whereas the fight-hand area IC indicates the density D of high density circuits such as are used at present. The upper area MCM indicates the ceramic multilayer technology or thin-film multilayer technology MCM's, which become more expensive with increasing compression. The lower area 1 indicates the only slightly increasing costs, with increasing compression, in the case of circuit boards produced from laminates according to the inventive process for MCM's. The products resulting from the inventive process have been marketed under the name DYCOstrate ®. Three pieces of information can be obtained from FIG. 1. Firstly, the manufacture of conventional circuit boards becomes much more costly as compression increases, but without achieving the desired high density circuits (see area LP). Secondly the MCM's produced in ceramic multilayer or thin film multilayer technology have a natural miniaturization limit, so that they also fail to reach the IC compression range despite high costs (see area MCM). Thirdly the two disadvantages of the known MCM technology (high costs and limits) are obviated by the process according to the invention (see area 1). Compared with conventional technology complex (MCM) circuit boards produced from metal-clad laminates according to the inventive process, are in a position to further approach the IC compression range.

Figure 2:
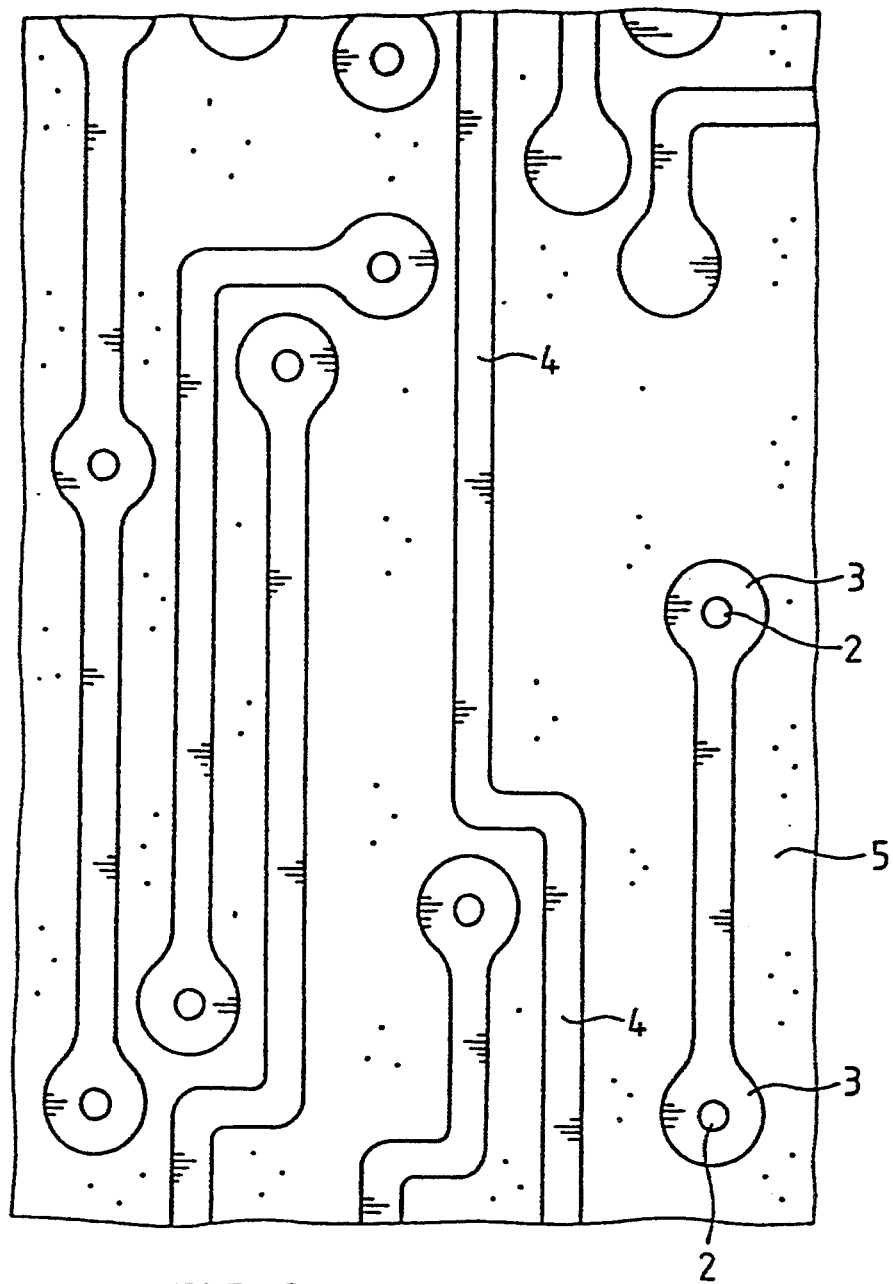
FIG. 2 A larger scale detail of an embodiment for current paths and plated-through holes for part of a circuit board.

FIG. 2 shows an embodiment of a signal line layer in a MCM in a 40× magnification. The current paths 4 are 75 μm, the plated-through holes 2 are 100 μm (tin coated much smaller), the soldering pads 3 have a diameter of 200 μm, i.e. as small as the smallest conventionally drilled hole, and the density of the plated-through holes is better than 10000/dm². The conductor film thickness is 25 to 50 μm. The metal-clad laminate from which such foils are produced only have the plated-through holes 2, whose production will be discussed hereinafter. These dimensions can be further reduced without great technical problems.

Figure 3:
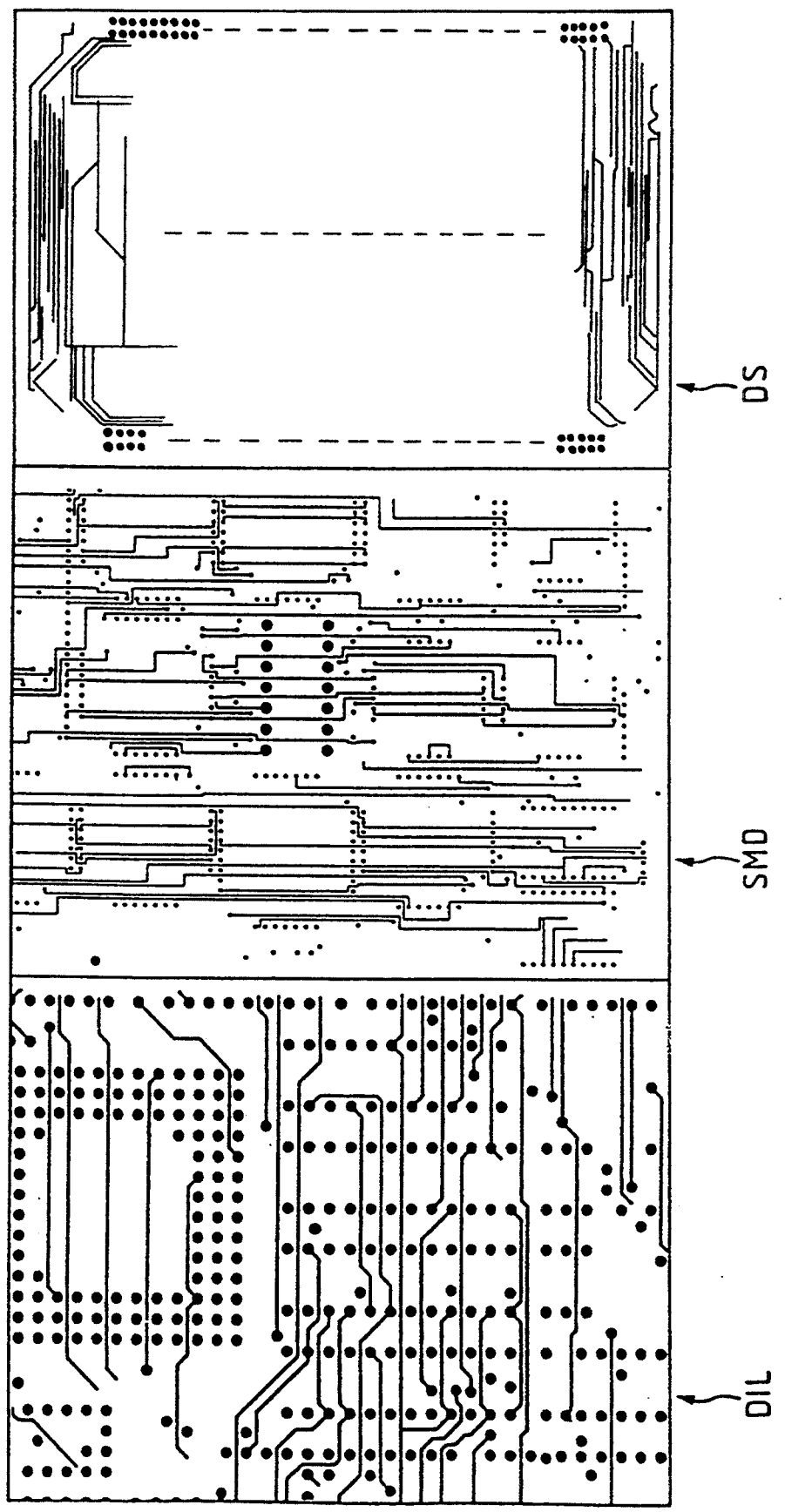
FIG. 3 A comparison of the conductor density of two conventional layouts, current paths and plated-through holes in DIL and SMD technology on the one hand and the greatly increased conductor density of an exemplified embodiment of current paths and plated-through holes of conductor boards produced from metal-clad laminates according to the inventive process.

FIG. 3 shows two embodiments of conventional circuit board technology compared with the manufacture of circuit boards using the metal-clad laminate according to the invention. These are details of not-assembled circuit boards. On the left-hand side is shown a circuit board produced by dual inline or DIL technology, in the center a board produced by SMD technology and to the right a circuit board DS produced from laminates according to the inventive process (DS stands for DYCOstrate ®). These three details of circuit board are shown at the same scale which approximates the actual sizes of the articles. FIG. 3 shows that the reduction of the diameter of the plated-through holes leads to a quadratically increasing compression of the structured circuit.

In the circuit board using DIL technology use is made of circular, metallic plating forms. Printed current paths based on conventional photochemical processes are located on the electrically insulating support. Plated-through holes interconnect the current paths on each side of a circuit board. The dimensions of the current paths and the plated-through holes are in the millimeter range. It is noteworthy that the diameter of the plated-through holes is greater by a factor of 5 than the width of the current paths.

In the SMD technology circuit board mechanically or galvanically produced plated-through holes are used, as well as electric current paths printed by the known photochemical processes. The circular, smaller plated-through holes interconnect two planes of the circuit board, e.g. its front and back and are used for assembly with simple, electronic components. The electrical contacting and mechanical fixing of such simple components takes place by means of solder surfaces (not visible, because the drawing shows a signal plane with no solder surfaces). Compared with the plated-through holes based on DIL technology the present SMD technology holes, including the solder surfaces and soldering pads, are smaller by a factor of approximately 3. The printed current paths are also narrower. As a result there is an increase in the number of current paths compared with the number of plated-through holes. The dimensions of the current paths and the holes are in the ½ mm range, being respectively 0.3 and 0.7 mm. The diameter of the plated-through holes is larger by approximately a factor of 3 than the width of the printed current paths.

The printed boards DS produced from metal-clad laminates according to the inventive process have plated-through holes produced by a proven plasma etching process and current paths structured by a photochemical process. The current paths are electrically insulated from one another by a thin non-metallic foil. The drastic increase in the number of printed current paths is noteworthy and only at a second glance is one aware of the plated-through holes. This compression of the layout is a direct consequence of the reduction of the plated-through hole diameter resulting from the inventive process. This compression is the first desired effect of the process. The plasma-etched holes have diameters well below 100 μm and can extend down to 20 μm. The width of the current paths is of the same order of magnitude. This process for the production of such metal-clad laminates is described in greater detail hereinafter relative to FIGS. 6a to 6g. Compared with the plated-through holes based on DIL or SMD technology, the plasma-etched holes used for the purpose in the present process are smaller by a factor of 30 or 10 respectively. The diameter of the plated-through holes are no longer larger by a factor of 10 as compared with the current path width, as in the DIL and SMD technologies, said factor being smaller, e.g. 3.2 or even 1 (same size). This plated-through hole diameter reduction means that per unit surface of the circuit board used it is possible to have more plated-through holes and current paths (compression or first desired effect), while there is also more space for current paths. This "additional" space for current paths is urgently required for the control, supply and contacting of the large number of inputs and outputs for highly complex components, which is the second desired effect of the inventive process. This is made clear in the detail of the circuit board DS in FIG. 3 showing the increase in the number of current paths relative to the number of plated-through holes (compared with DIL and SMD technologies). The "additional" space permits a completely different construction of the circuit boards. As a result of the now possible displacement of the current paths into the individual dual planes of a generally multilayer circuit board the third desired effect is obtained, namely the number of planes of such inventive circuit boards is drastically reduced, e.g. from 25 to 3 or 4. This is described in greater detail hereinafter relative to FIG. 6.

Figure 4:
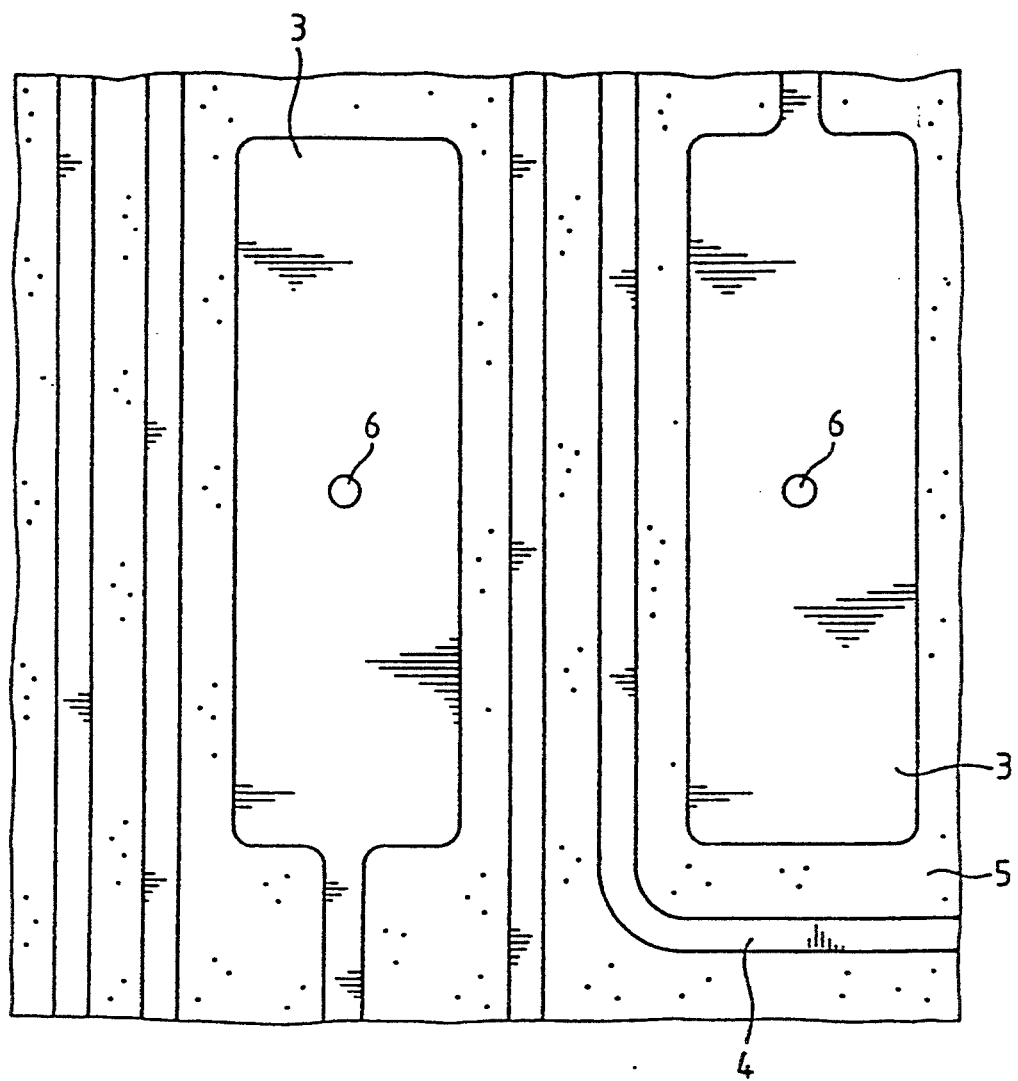
FIG. 4 On a larger scale, current paths and prepared solder surfaces, the latter having plasma-etched plated-through holes.

FIG. 4 is an embodiment of prepared solder surfaces of circuit boards, which are also to be used for introducing plasma-etched plated-through holes. It is a detail of a not as yet assembled circuit board and is shown at an approximately 35× magnification. The plasma-etched plated-through holes are in this case circular holes 6, which are introduced centrally into rectangular, prepared solder surfaces 3 for e.g. connections or terminals. The circular shape of the openings of the plasma-etched holes is obviously not necessary and it is also possible to produce holes with other regular or irregular shapes. The holes are interconnected by means of current paths 4, which are printed on an electrically insulating support 5 and electrically insulated with respect to one another by the latter. FIG. 4 also shows that the plasma-etched holes are smaller by at least an order of magnitude than the holes produced galvanically by mechanical drilling or wet chemistry. It is also clear that such small holes, which are much smaller than 100 μm can if necessary be directly formed in the circuit boards. In this example, the plated-through hole is approximately 30 times smaller than the prepared solder surface. Such a large, prepared solder surface is used for the macroscopic soldering using correspondingly large soldering pads (cf. description of FIG. 2).

Figure 5:
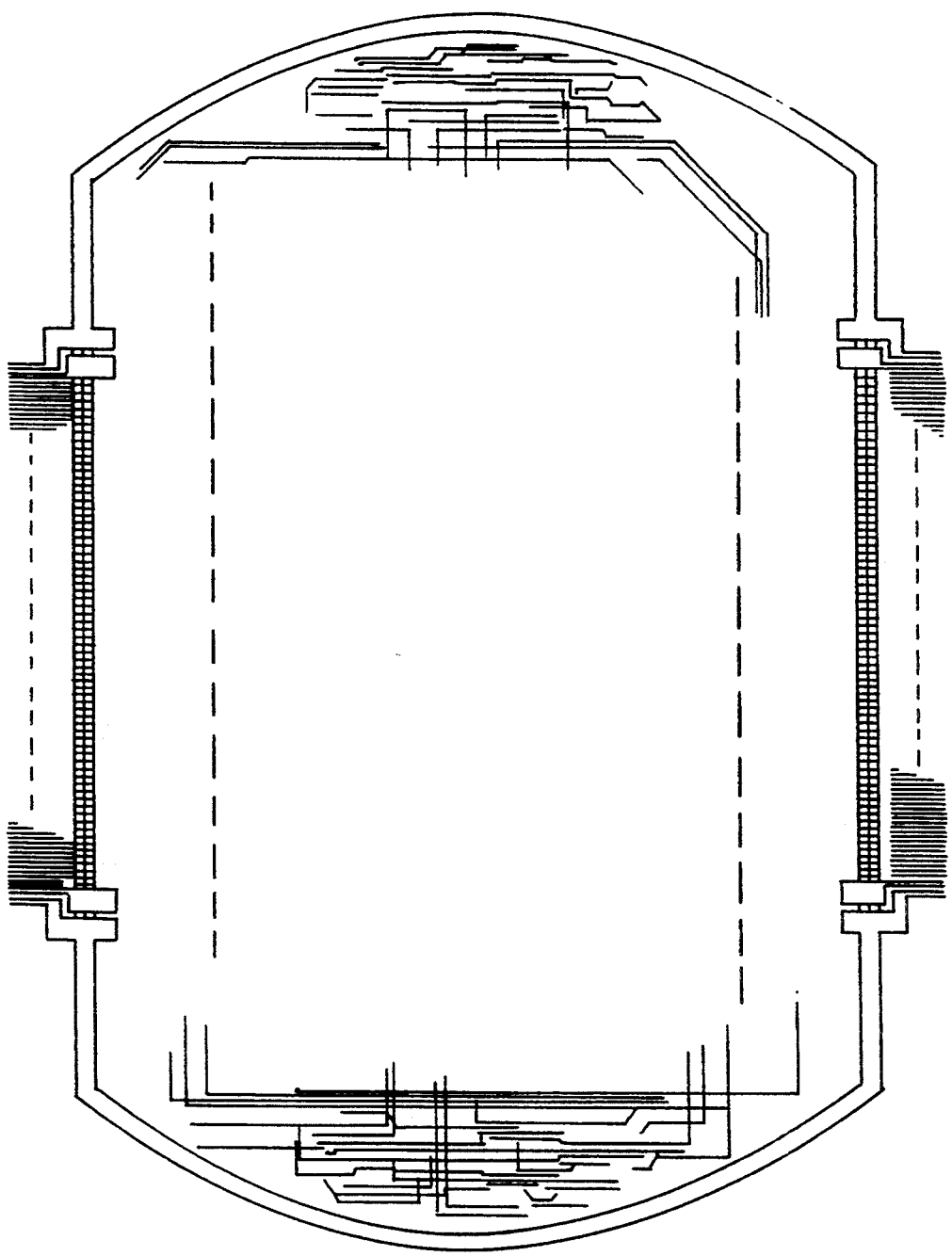
FIG. 5 On a larger scale an exemplified embodiment of two layers of current paths of a MCM formed from metal-clad laminates according to the invention.

FIG. 5 shows a further development of the sub-100 μm technology for circuit boards made possible by laminates according to the invention. It is an approximately twice magnified detail. It is possible to see that the near superimposing of two layout layers produces a very dense pattern (compressed wiring pattern), complication increasing with more layers. FIG. 5 shows that the reduction in the number of layers of circuit boards resulting from the inventive process not only leads to material savings (fewer layers means less material), but also significantly reduces work, because this is significant when it is necessary to produce circuit boards with numerous layers.

FIG. 6 shows the individual stages 6a to 6e of the manufacture of an embodiment of a metal-clad laminate using the process of the invention. This representation is very diagrammatic in order to illustrate the process. Known wet chemical processes or plasma etching processes are used for etching purposes. Combinations of these processes are also possible. In all etching processes it is generally necessary to ensure that those parts which are not to be etched away are protected by a photoresist coating.

Figure 6A:
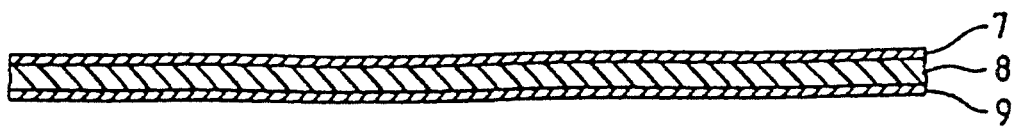
FIG. 6a through 6g Individual steps (6a–6e) in the manufacture of a metal-clad laminate according to the inventive process and which in further steps leads to a MCM (e.g. according to FIG. 5).

FIG. 6a shows in section a two-layer conductor foil comprising a first metal layer 7, e.g. of copper, as well as a second metal layer 9, e.g. also of copper, and finally an intermediate non-metal layer 8, e.g. of polyimide or epoxy resin. The thickness of this three-layer film is less than 500 micro-meters (μm) and preferably 50 to 120 μm, but it can naturally also be thinner. Such a film constitutes the starting material for the laminates to be produced in the inventive process for the use for multilayer circuit boards with plated-through holes. This three-layer film can be rigid or flexible.

Figure 6B:
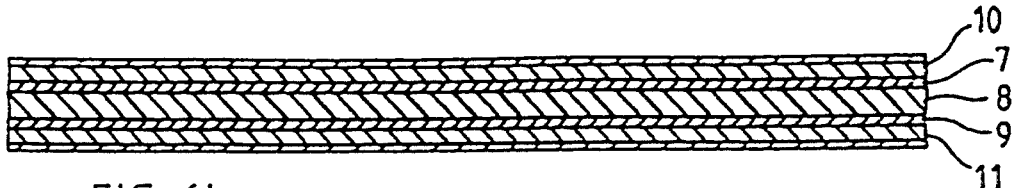

In FIG. 6b the two metal layers 7, 9 are coated with photoresists 10, 11. Prior to this photoresist coating process, the conductor film is usually cleaned by chemical etching or jet scrubbing. It is possible to apply commercially available, dry or liquid photoresist. The photoresist 10 covers the metal layer 7 and the photoresist 11 the metal layer 9.

Figure 6C:
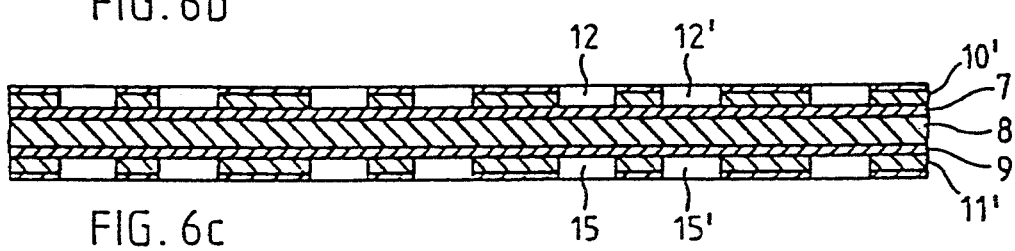

Using a known, proven photochemical process, in FIG. 6c, the holes to be plated-through are structured. In accordance with a photomasks PM, the photoresist layers 10, 11 are exposed and emplacements for the openings 12, 12', 15, 15' are produced. These openings 12, 12', 15, 15' constitute through holes prepared for through-plating holes extending from the outer surface of the photoresist-coated conductor foil to the metal layers 7, 9. The photoresist layers provided with such holes 12, 12', 15, 15' are called photoresist layers 10', 11'. Typically the openings have diameters of less than 100 μm, i.e. they are very small.

Figure 6D:
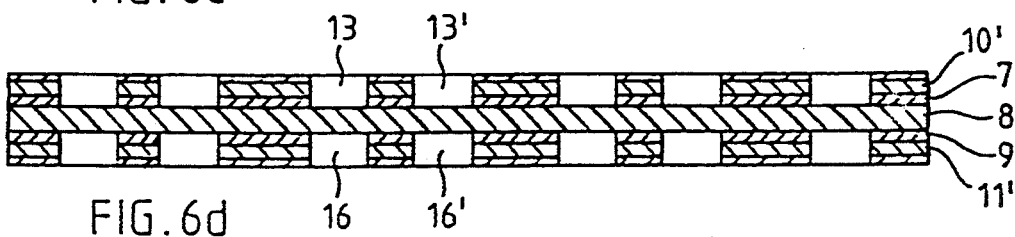

In FIG. 6d the metal layers 7, 9 are wet chemically etched through in the vicinity of the openings 12, 12', 15, 15'. The openings 13, 13', 16, 16' resulting from this known process stage extend from the outer surface of the photoresist-coated conductor foil to the intermediate non-metal layer 8. These openings 13, 13', 16, 16' are also through hoes prepared for through-plating holes. The dielectric is exposed following this process stage.

Figure 6E:
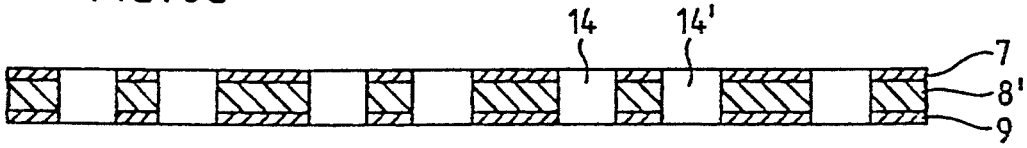

In FIG. 6e the photoresist layers 10', 11' are removed by wet chemical stripping. The intermediate non-metal layer 8 is removed by plasma etching during the same etching process in the vicinity of the openings 13, 13', 16, 16'. The non-metal layer which has thus been "plasma drilled" is designated 8'. This process stage leads to small throughholes 14, 14', through which it is subsequently possible to inter-contact the two metal layers 7, 9 of the two-layer conductor foil. The diameter of these small throughholes 14, 14' is below 100 μm and can extend down to 20 μm. The two-layer foil circuit board diagrammatically shown in FIG. 6e having thin metal layers 7, 9, a thin, intermediate non-metal layer 8' and small through-holes 14, 14' constitutes an embodiment of a laminate for use for multilayer circuit boards with plated-through holes. It is a laminate, because the through-holes 14, 14' do not yet constitute the electrically conductive connections in the form of interfacial connections between the metal layers 7, 9 and the complete circuit design, i.e. the current paths are not yet defined. The through-holes 14, 14' are only photomechanically drilled, prepared interfacial connections, which may or may not be used in the layout. In the case of universal grids the laminate can be intermediately stored, while in specific layouts it can be further processed all in one. This is illustrated by FIGS. 6f and 6g.

Figure 6F:
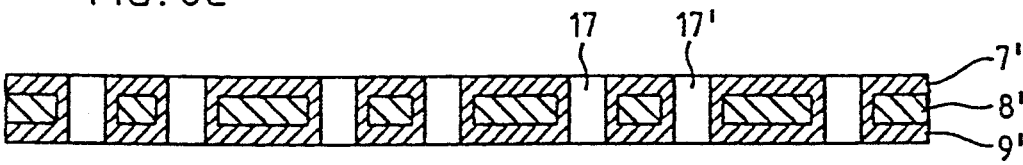

In FIG. 6f a through metallization takes place of both the inner surfaces of the through-holes 14, 14' and the outer surfaces of the metal layer 7, 9 of the laminate. This is e.g. a galvanically produced reinforcement of the metal layers 7, 9, which will subsequently be called reinforced metal layers 7', 9'. As a result the through-holes 14, 14' are given a plating, so that they form electrically conducting connections between the reinforced metal layers 7', 9'. These plated-on throughholes 14, 14' are now called interfacial connections 17, 17'. In this form the product is still a laminate, but is ready for producing layouts.

Figure 6G:
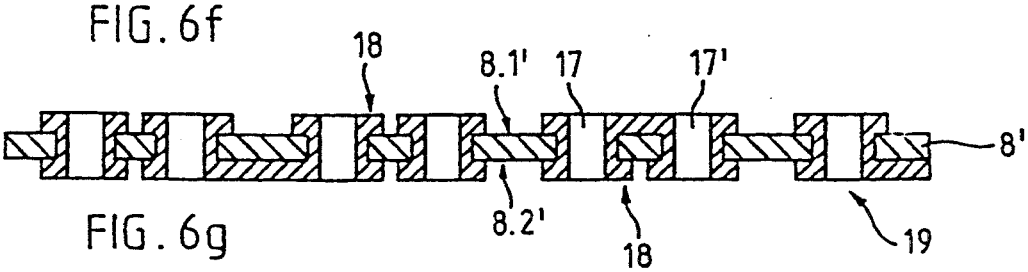

FIG. 6g shows how the laminate from FIG. 6e or 6f, following photochemical structuring (layout) of the layers 7', 9' can be completed to form the printed circuit board. According to a circuit design the current paths 18 are etched out as a wiring pattern and consequently a two-layer foil circuit board 19 is produced. The metal between the conductors is etched down to the surfaces 8.1', 8.2' of the thin, intermediate, non-metal layer 8', so that the current paths 18 are now carried by said layer 8' and are electrically insulated against one another by the surfaces 8.1', 8.2' down to the openings of the interfacial connections 17, 17'.

The process stages 6a to 6e or 6f for the production of a metal-clad laminate according to the invention and (with stages 6f and 6g) a conductor foil 19, involve proven and therefore risk-free technologies used in the circuit board industry. They can be performed by the expert with standard equipment with the knowledge of the present invention. The inventive process has the advantage that all the process stages can be performed at the same time in all the surface areas of the conductor foil according to FIGS. 6a to 6d and the laminate according to FIGS. 6e to 6g. Thus, simultaneous etching takes place on all the plasma etching medium-exposed areas, in the present case on both sides of the metal-clad laminate. Thus, e.g. when using very thin photo lacquers, they can be simultaneously removed with the plasma etching of the through-holes 14, 14'. It is possible to plasma-etch, or more correctly plasma-drill 10000 holes simultaneously. The etching time in the case of two simultaneously etched sides of the laminate is halved. It is also possible to simultaneously plasma-etch different structures on both sides. As a function of the layout, e.g. on one side can be etched interfacial connections and on the other stage blind holes, this taking place simultaneously in one process stage. All these unique advantages of foil etching considerably reduce manufacturing costs. This must be distinguished from time-sequential mechanical drilling or laser drilling of through-holes and blind holes. Such processes are characterized by numerous process stages, comparatively poor output levels and high costs.

Simple inexpensive materials are used. Use is made of thin, metal-coated foils, e.g. thin, uncured polyimide or epoxy resin foils (12 to 100 $\mu$m thick) coated with a thin copper foil (3 to 70 $\mu$m thick). For the production of the starting material for the three-layer foils according to FIG. 6a the layers are e.g. mechanically interconnected in simple manner by pressing and heat action, so that there is an intermediate non-metallic layer, which electrically insulates from one another the two metal layers. Other processes are known for the production of such foils and are widely used. Thin metal and non-metal foils of such materials ($\sim$100 $\mu$m thick) are commercially available. For the production of a three-layer foil according to FIG. 6a such a thin metal/non-metal foil is mechanically connected by pressing and heat action to a thin copper foil in such a way that there is an intermediate non-metal layer, which electrically insulates from one another the two metal layers.

In order to prevent undesired effects, such as high attenuations, reflections or cross-torque of signals, when using high frequencies (up to >1 GHz) it is necessary to size-relate within narrow ranges not only the spacings of the signal layers and ground layers, but also their widths. The uniform thickness of the dielectric layers, the low attenuation values and dielectric constants of the foils used and also the narrow tolerance ranges of the dielectric constants of the foils used in the x and y-directions satisfy such requirements of high frequency technology. Therefore the present invention relates to printed circuit boards which, as a result of the thin metal and non-metal layers (in each case 12 to 150 $\mu$m thick) and the small interfacial connections (diameter below 100 $\mu$m) are eminently suitable for use in the high frequency range. This is of great technical significance, because the tendency is e.g. for personal computers (PC's) to operate in timed manner of several hundred megahertz not only in the central processing unit, but instead such clock frequencies are also sought for the bus system on circuit boards. As a result of the macroscopic dimensions of the layer thicknesses and conductor widths and due to the changing composition and thickness of the dielectric formed from glass fibre fabric and the varying thickness of the matrix of epoxy and polyimide resin, this is difficult to achieve with conventional circuit boards.

Figure 7:
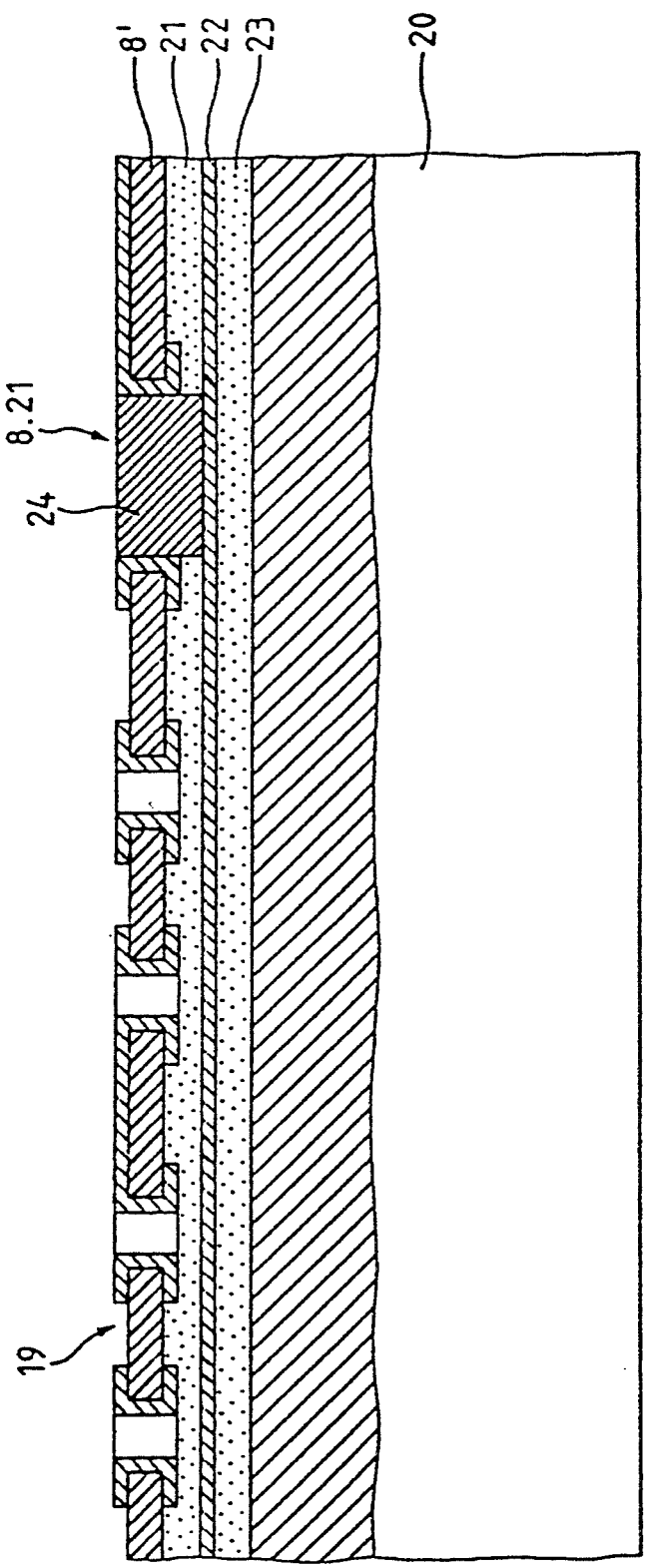
FIG. 7 An exemplified embodiment of part of a circuit board produced from a metal-clad laminate according to the inventive process and which is connected to a mechanical support.

FIG. 7 shows an embodiment of part of a circuit board produced from a metal-clad laminate in accordance with the process of the invention and which is connected to a mechanical support. One of the characteristics of circuit boards according to the inventive process is that they are very thin and can be flexible or rigid. If mechanical strength is required, as the functions were deliberately separated, it is then necessary to introduce the strength function. In this case a connection with a mechanical support is provided, e.g. for fixing said circuit board in a casing, or for removing the heat generated by the components of said board, etc. Such a conductor foil can be processed to the circuit board by laminating or bonding onto a mechanical support.

A circuit board 19 produced from the laminate according to the inventive process (cf. FIG. 6) can be equipped with components before or after attachment to a mechanical support. Advantageously such a circuit board or partial circuit board 19 is equipped to such an extent that it is already complete in those areas which are no longer or are only difficultly accessible after fitting to a mechanical support. If, as shown in FIG. 7, one side of a thin partial circuit board 19 is to be connected to a mechanical support, said concealed side can be equipped beforehand.

A mechanical support 20 can be made from metal, plastic, ceramic, prepared paper, prepared cardboard, etc. It can be provided on its surface with an electric power supply 22, e.g. in the form of a supply layer. The supply layer 22 is so structured that it has electrically reciprocally insulated conductors, which permit the transmission of technical d.c. voltages. It is possible to produce such a supply layer 22, cf. FIG. 7, in that a thin, completely structured partial circuit board or laminate foil 19 is bounded on one side with adhesive films of e.g. acrylic, epoxy or polyimide resin with a mechanical support or support plate 20 by the use of pressure and temperature. At its interface to the laminate foil 19 the support plate can have an electrically functional conductor plane, which has previously been produced on the plate 20 using conventional circuit board technology processes. Advantageously the support plate 20 only carries rough conductor structures, such as e.g. supply conductors or faces. The stable mechanical support 20, which is thick compared with the thin circuit board 19 and the supply layer 22 is, if necessary, electrically insulated from the supply layer 22 by a plastic film 21.

In order to use the supply layer 22 for the electric power supply of the circuit board 19, it is naturally necessary to have a certain number of electrical connections between the layer 22 and the board 19. In order to achieve this, in the same operation as for producing the plated-through holes or micro-holes 17 (cf. FIGS. 6a to 6g), larger holes 8.21 are produced in the intermediate non-metal layer 8' and have a diameter of 200 to 400 $\mu$m. If an adhesive film of acrylic or epoxy resin pre-drilled at the positions of the holes 8.21 is used for bonding the laminate foil 19 to the support plate 20, then at said predrilled positions are formed the holes 8.21 and extend down to the supply layer 22. For example, by applying tin solder or e.g. by plating on a metallic form in these holes, the circuit board 19 and the supply layer 22 can be inter-contacted by means of power-supplying interfacial connections 24. The diameter of the interfacial connections 24 need not be minimized, because usually it is only necessary to have a limited number of such power-supplying interfacial connections 24.

Thus, as a result of the inventive process, it is possible to achieve a separation between very small current paths for the transmission of high frequency signals of a thin e.g. two-layer circuit board 19 with correspondingly small interfacial connections between the conductor planes of the circuit board 19 and the power supply leads with technical currents and e.g. low voltage d.c. voltages across a supply layer 22 and finally the mechanical support layer. As shown in FIG. 7 a circuit board produced according to the example is constituted by three components, namely a high density circuit board 19 for the signal plane, a less compressed electric power supply 22 and a mechanical support 20 as a strength and/or cooling plane.

The advantage of such an assembly is that from a two-layer foil circuit board produced from a three-layer foil (cf. FIG. 6a) and a laminate (cf. FIG. 6e) using the process of the invention and according to FIG. 6, by subsequent application of further metal and non-metal layers multilayer circuit boards can be produced. In the exemplified embodiment of FIG. 7 there is consequently a three-layer circuit board, which also has an external mechanical support. The necessary process stages once again involve proven circuit board industry technologies. Thus, they can be performed by the expert on standard equipment with the knowledge of the present Invention.

Figure 8:
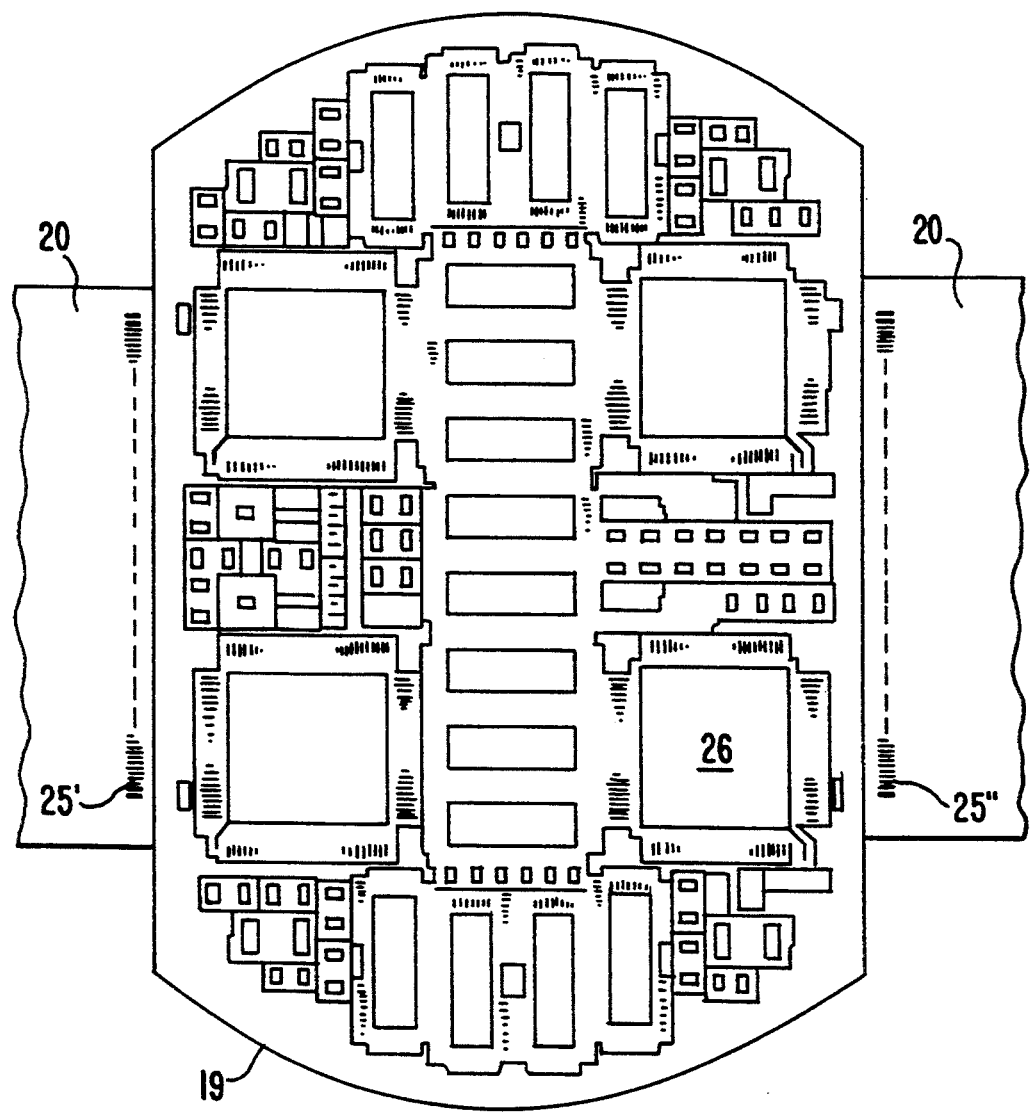
FIG. 8 An exemplified embodiment of a completely assembled MCM produced from metal-clad laminates according to the inventive process.

FIG. 8 shows a highly integrated, already equipped circuit board, a MCM, which has been produced from a metal-clad laminate according to the process of the invention. The representation has a 1.5× magnification. A flexible or rigid, thin circuit board 19 (e.g. In the form of a two-layer circuit board according to FIG. 6) is equipped with several components 26. These components can be of varying complexity, can have a larger or smaller number of electrical connections for the power supply and can have a varying number of contacted current paths (e.g. across the current paths 18 of FIG. 6g). Advantageously these current paths are on both the planes of the circuit board 19 and interconnect the components 26. The current paths of different planes can be electrically interconnected by means of interfacial connections (e.g. connections 17, 17' of FIG. 6g). The connections for the power supply of the components 26 have, via power-supplying interfacial connections (e.g. connections 24 in FIG. 7) an electric contact with conductors of a supply layer (e.g. layer 22 in FIG. 7). This supply layer cannot be seen in FIG. 8 and is in fact positioned below the circuit board 19 and is concealed by the latter. The circuit board 19 has contact points 25', 25", by means of which the circuit board 19 can e.g. be electrically contacted with other conductors or components. The circuit board 19 and the supply layer are fitted on an external, mechanical support 20 (e.g. on the support 20 of FIG. 7). In this way it is possible to install the unit comprising the circuit board 19, the supply layer 22 and support 20 in random other equipment.

FIGS. 9a to 9d show an example of the sequential steps of manufacture of a universal substrate as a metal-clad laminate. FIG. 9a shows a foil 8 coated on both sides with copper 7, 9, which has a regular pattern of blind holes 12 in a two-sided etched resist layer 10, 11 up to the copper layer 7, 9. Such a hole configuration, which is universal or layout-oriented, is exposed, developed and etched on an etch resist layer. Following the etching of the copper of the copper layer 7, 9, as shown in FIG. 9b, recesses or windows 13, 16 are formed, while there are also blind holes, in which the plastic film 8 is exposed. The etched layers 10, 11 are removed and in these points of the film 8 exposed in the copper layers 7, 9, in the manner shown in FIG. 9c, etching takes through of the passage or holes through the film using a further etching process, e.g. a plasma etching process, as described in conjunction with FIGS. 6a to 6e.

Following plasma etching the holes are galvanically plated through by means of copper, or are electrically through-connected using other methods (FIG. 9d). The interfacial connection is designated 17 and as a result the hole diameter is decreased, but said holes can also be filled for cooling purposes or for simpler plating-through processes. Very cost effective is e.g. a screen printing process by means of which electrically conductive material, such as conductive paste is introduced into the holes and subsequently hardened, or by means of a copying-like process, in which a conductive toner is introduced into the holes and is then solidified by heat (toner melting). It is possible to produce interfacial connections, where the holes are maintained, e.g. by evaporating on solder (tin solder), while the copper layer between the holes can also be covered with it.

This leads to a two-sided metal-coated, two-dimensionally conductive foil with through-plated holes (FIG. 9d), such as can be subsequently contacted in the desired conductor configuration with the conductors by means of soldering pads. These conductors are produced in a second exposure and etching process. This is followed by production in the circuit board production process using the universal substrate as the semifinished product, which is in this example wound onto a reel or roll.

Figure 10:
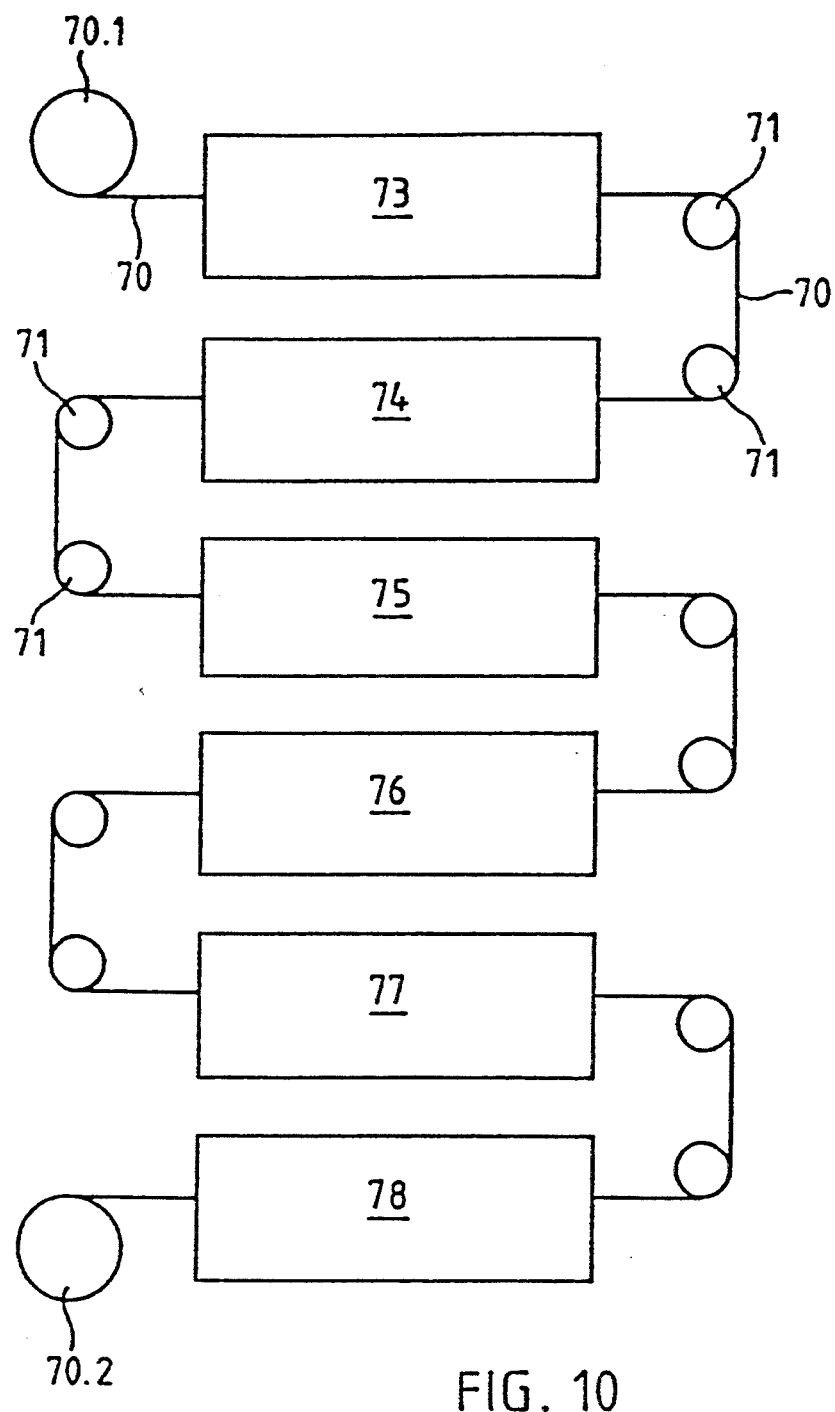
FIG. 10 Diagrammatically a process for producing plated-through holes in foil material on belt systems, which in the form of foil material is then rolled up as a continuous universal substrate and is kept ready for further processing.

FIG. 10 finally shows how semifinished products, universal circuit boards, circuit boards, etc. can be produced with plated-through contacts on belt systems in a continuous process. The advantage of a continuous process is that foils can be processed roll-to-roll. The etching of holes in two-sided coated plastic foils, as shown and described relative to FIGS. 6a to 6g and 9a to 9d, can take place with a belt system of this type. The application of the conductor configuration can also take place in a continuous process. The lamination of finished circuit boards with onesided metal-coated foils can also take place with an adhesive film from the roll, so that up to a certain extent multilayers can be produced from the roll. The belt system can be used for the prior process of semifinished product production and for the main process of circuit board production. This leads to a better system utilization.

From a supply roll 70.1 the plastic film 70, which is provided on both sides with a metal layer, can be supplied by means of different process stages and conveying rolls 71 to a take-up roll 70.2, which receives the finished product, namely the perforated foil or film. In a first process stage using conventional coating processes 73 such as rolling up, spraying, dip coating or electrophoretic separation, the plastic film 70 is provided on both sides with a photoresist coating, which is subsequently dried in a continuous heating furnace 74. This is followed by the necessary structuring of the hole configuration by exposure in a UV exposure means 75 with subsequent development in a developing means 76. Then, in a metal etching and photo lacquer stripper 77, the metal layer is etched away at the recesses, where through-holes or holes are to be formed and then the remaining photoresist is removed. The through-holes and/or holes are then etched out in a plasma reactor 78.

The incorporated interfacial connection process can be brought about using conventional band galvanics (Bandgalvanik) or by passing electrically conductive material into the holes or by evaporating or sputtering on metallic layers.

After showing how numerous different passages can be made in the plastic films, which are subsequently through-contacted, the following sequence of FIGS. 11 to 16 show how a four-layer film circuit board is produced using this procedure.

Figure 11:
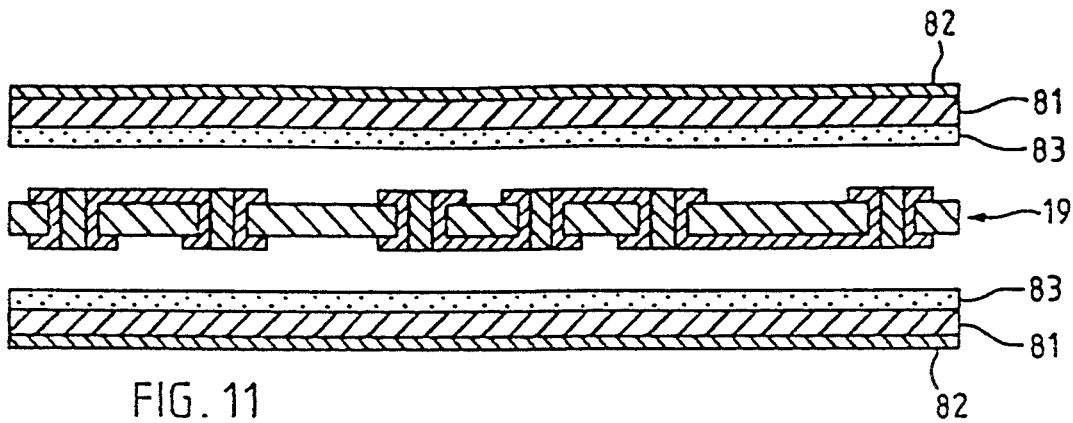
FIGS. 11 to 16 The different stages in the manufacture of a four-layer circuit board, which reveals the principle of constructing such boards with a plurality of layers.
Figure 12:
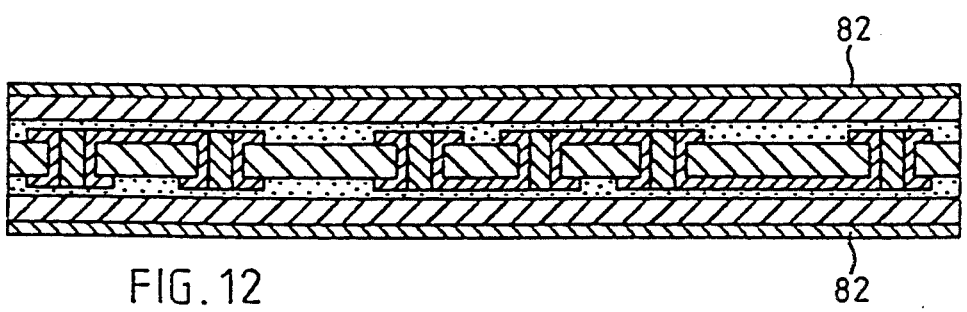
Figure 13:
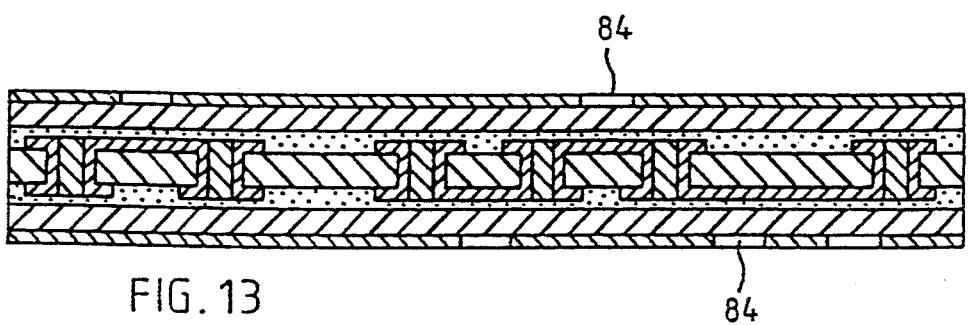
Figure 14:
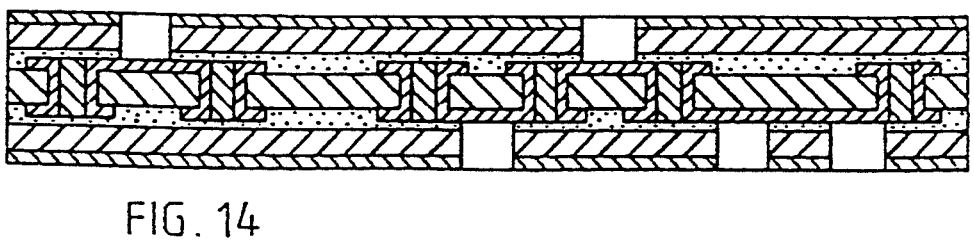
Figure 15:
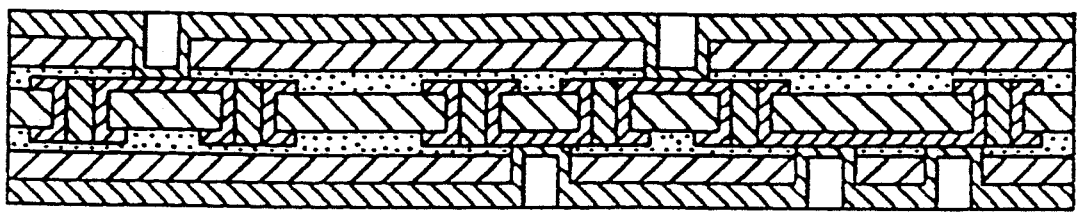
Figure 16:
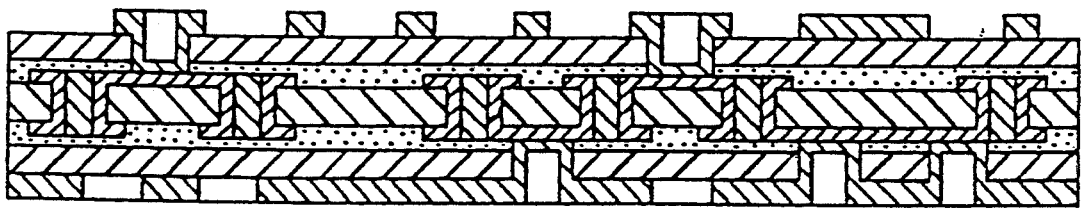

A film circuit board 19 produced according to FIGS. 6a to 6g is provided on both sides with a one-sided, metal-coated foil 81, 82. This takes place e.g. by means of an adhesive film 83. FIG. 11 shows the corresponding assembly prior to lamination, including the circuit board 19 and above and below the circuit board a foil 81 with a metal layer 82 and adhesive 83. After laminating the upper and lower structures on to the circuit board an approximately 3× thick foil is obtained, which has on both sides a metal layer 82 and in the core area contains in enclosed form the foil 19 according to FIG. 6g (shown in FIG. 12). This gives the starting position shown in FIG. 6a with an intermediate product on which a given conductor pattern is to be applied and in which through etching processes are to be performed. As in the earlier production stages on both metal-coated sides, the patterns for the interfacial connections are applied using a photographic process, the result being seen in FIG. 13. This is followed by the production of the blind holes, which are produced in the same way as the through-etchings described in conjunction with FIGS. 6a to 6e. Following plasma etching the pattern of the blind holes is obtained leading to the conductor layer of the thin circuit board 19 enclosed within the assembly. FIG. 14 shows the connection holes 84 and FIG. 15 shows them after plating with a metal layer. In the represented embodiment on one side two and on the other side three blind holes extend into the intermediate plane with the circuit board 19. By means of a further photographic process the conductor pattern is produced and the four-layer film multilayer according to FIG. 16 is obtained. By repeating the process stages according to FIGS. 11 to 16 it is possible to produce a five or six-layer circuit board and so on, on one of the two or both of the sides of the product. This process can be continued until the necessary number of layers in a multilayer circuit board is obtained. It has all the advantages mentioned relative to FIGS. 6a to 6g, due to the simultaneous etching of several sides of the circuit board.

An important advantage of this process is made apparent by the process stages of FIGS. 11 to 16. There are no long "passages" which are replaced by plated-through holes, which in each case extend "one layer deep" and can therefore be produced with the maximum precision, because ultimately the precision only has to be maintained over one layer. This consequently leads to no tolerance error chain, such as occurs when stacking multilayers according to the conventional procedure and which produces considerable wastage. The avoiding of long plated-through holes leads to a better thermal behavior. The multilayers built up according to the invention have a more robust behavior with respect to temperature fluctuations.

If products resulting from a large number of process stages and which become constantly thicker due to the application of ever more layers, at any time during their formation they can be individualized and further processed as a piece article, because as a result of excessive rigidity they can no longer be guided over rolls or rolled up. This means that in certain circumstances part of the manufacturing steps must be performed on quasi-continuous material and another part, of the manufacturing process which can be precisely the same steps, must be performed on the piece article. This means that the processing mode (roll-to-roll or piece article) is only dependent on the product and not the processing stage, so that in certain circumstances a processing stage, which ideally would be suitable for roll-to-roll processing must be performed with the piece article, merely because the said product cannot be rolled up (due, for example, to critical bending radii).

In order to reduce this effect a further measure assisting roll-to-roll manufacture can be adopted. Starting materials and/or intermediates are conditioned in such a way that at least in part of the processing stages they can be processed as a quasicontinuous, jointed belt or "fold worm" and said intermediate and/or end products can be stacked as a fold stack, as is known from continuous paper.

The advantages of the fold stack compared with the roll are in particular that in the stack the product is not under tension and is not bent. The effective processing of the fold stack differs only slightly from the effective processing from and onto the roll, except that the product passes through one processing stage in a more or less closely folded formation.

The "fold worm" is formed from quasi-continuous film material in that in said material, which comprises a plastic film or several superimposed plastic films with superimposed and/or intermediate metal layers or conductor layers, predetermine buckling or kinking points are produced transversely to a quasi-continuous extension by means of suitable weakening along advantageously equidistant lines. The formation of a fold worm from film material in piece article form consists of the individual pieces being interconnected with a kinkable connection (flexible connection with predetermined breaking points) so as to give a quasi-continuous series. The film material, which resembles a series of piece goods, can be base material or an intermediate produced by other processes.

The predetermined kinking points in the quasi-continuous material are produced by metal weakening, e.g. perforations or thickness reductions, together with functionally relevant openings, such as e.g. those for plated-through or blind holes, this taking place in the same production process stages, advantageously by plasma etching. In the same etching stage the necessary rows of holes can be produced along the material longitudinal edges for conveying by means of a sprocket wheel system. This means that the production of the predetermined kinking points and the conveying hole rows requires no additional process stages. This leads to the further advantage of limiting to the absolute minimum the tolerance between the predetermined kinking points or conveying hole rows and the functionally relevant openings, so that the predetermined kinking points and/or conveying hole rows can also be used as a straightening aid arrangement for further processing stages.

The flexible connections for connecting film material, which resembles a series of piece goods, are e.g. produced by the application of adhesive films in a separate operation. After producing the flexible connections, it is possible to etch in the above-described manner conveying hole rows, which are advantageously etched together with the functionally relevant openings and can therefore be used as straightening aids.

Figure 17:
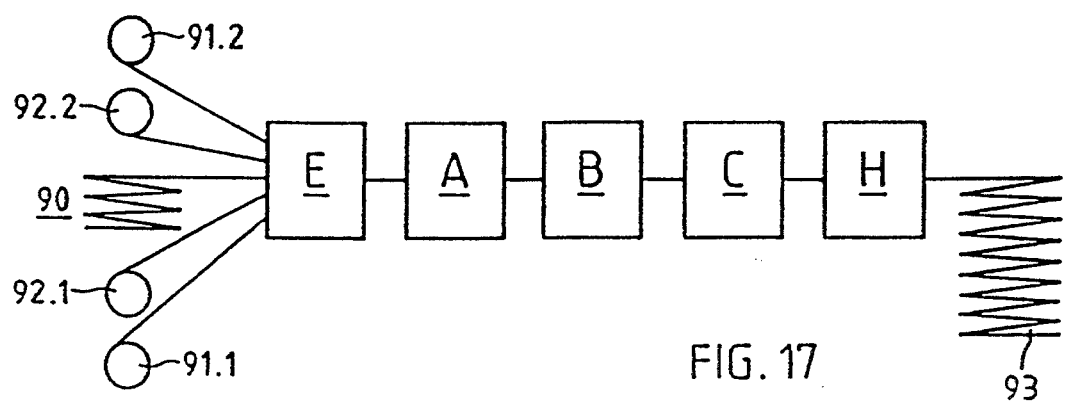
FIGS. 17 and 18 Examples of a supporting measure in processing on belt systems, such as e.g. according to FIG. 10.

FIG. 17 shows a further processing mode with respect to a product already in the form of a fold stack. Onto circuit boards with two conductor layers (fold stack 90) e.g. two-sided lamination takes place from a one-sided metal-coated foil in a process stage E. The one-sided coated foils are supplied from rolls 91.1 and 91.2, as is an adhesive layer for the joining of the different foils supplied from rolls 92.1 and 92.2. The same process stages A, B, C and H are performed, as described in conjunction with FIGS. 11 to 16, in which the laminated-on foil layers are processed. In process stages A and B not only the functional relevant openings, e.g. the blind holes for the connection of the outer conductor layers to the inner layers can be etched in the plastic films, but also openings or partial removals for weakening the material at the predetermined kinking points, whose positions are predetermined by the existing predetermined kinking points in the product 90. In addition, conveying hole rows can be produced.

This process leads to a quasi-continuous series of film circuit boards connected by predetermined kinking points and having four conductor layers, which are set down as a fold stack 93. This stack can e.g. be fed directly into an apparatus for automatic assembly, in which the individual circuit boards are advantageously separated from one another and the areas with the conveying hole rows are separated. However, it can also be a laminate, whose outer conductor layers have to be individualized or which has to be processed with further foil layers to foil circuit boards with more than four conductor layers.

According to a variant, with a correspondingly reduced inherent rigidity of the foils as from rolls 91.1 and 91.2 in the process according to FIG. 17 no openings or material removals are made for the predetermined kinking or buckling point, i.e. the points in the fold stack 90 are sufficient to fold to a fold stack the product comprising three foil layers.

Figure 18:
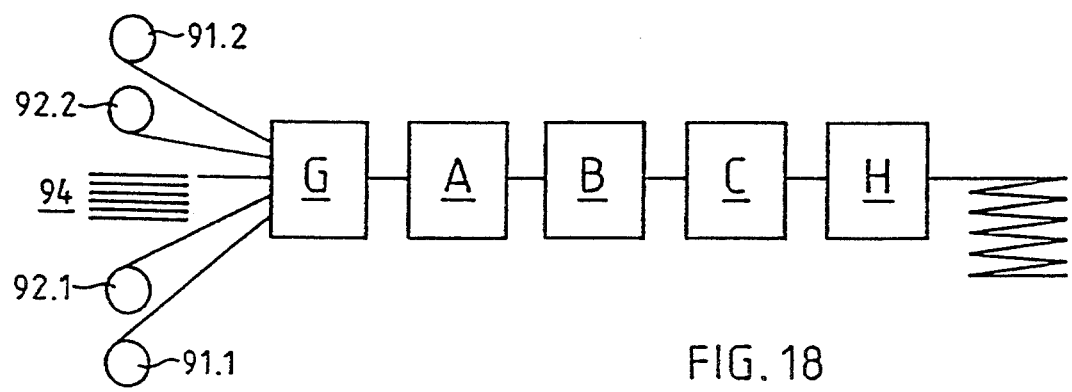

FIG. 18 shows another variant of the above process. Piece article-like foil material 94, e.g. still unworked foils or intermediate with one or more foil layers, is fed in a processing stage G. Onto the piece article-like foil material 94 is to be laminated e.g. on either side a further foil layer as from the rolls 91.1 and 91.2 with the aid of adhesive layers as from the rolls 92.1 and 92.2. By laminating together the piece article-like intermediate and the quasi-continuous, flexible foils from the rolls 91.1 and 91.2 a fold worm is obtained, which can be processed in the following stages A, B, C, H in the manner described hereinbefore.

If the foil material supplied from the rolls 91.1 and 91.2 is somewhat wider than the piece article-like foil material 94 and has conveying hole rows, then the resulting fold stack can be conveyed with the aid of sprocket wheels. Corresponding conveying hole rows can also be made in the processing stages A and B.

We claim:

1. A process for the production of multilayered printed circuit boards with extremely dense wiring comprising the steps of producing a metal clad laminate having an insulating layer and first and second electrically conductive layers bonded to opposite surfaces thereof and having a total thickness of less than 500 $\mu m$;

in a first photochemical processing, forming a plurality of through-holes in the first and second electrically conductive layers;

with plasma etching, selectively forming openings through the insulating layer at selected locations of the through-holes in the conductive layers;

depositing electrically conductive material through the through-holes in the insulating layer electrically interconnecting the first and second conductive layers; and in a second photochemical processing step, forming high-density wiring patterns concurrently in the first and second electrically conductive layers.

2. A process according to claim 1 and further including bonding the printed circuit board to a power supply board, and bonding the printed circuit board and the power supply board to a substantially rigid support.

3. A process according to claims 1 and including concurrently forming a plurality of printed circuit boards and stacking groups of the printed circuit boards to form a printed circuit assembly.

4. A process according to claim 1 and including forming an elongated strip of interconnected, individual printed circuit boards, forming defined fold lines between printed circuit boards, and forming a stack of the printed circuit boards by folding the elongated strip so that successive ones of the printed circuit boards lie on top of each other.

5. A process according to claim 1 wherein the step of depositing electrically conductive material includes plating electrically conductive material in the through holes and on adjacent areas of the conductive layers.

6. A process according to claim 1 wherein the step of depositing electrically conductive material includes screen-printing electrically conductive material in the through holes and on adjacent areas of the conductive layers.

7. A process for the production of a plurality of multilayered printed circuit boards with extremely dense wiring comprising the steps of providing an elongated strip of a thin insulating material;

producing a series of metal clad laminates along the strip, each laminate having a portion of the strip as an insulating layer and first and second electrically conductive layers bonded to opposite surfaces thereof and having a total thickness of less than 500 $\mu m$;

in a first photochemical processing, forming a plurality of through-holes in the first and second electrically conductive layers of each laminate;

with plasma etching, selectively forming openings through the insulating layer at selected locations of the through-holes in the conductive layers;

plating through the through-holes in the insulating layer to form electrically conductive passages electrically interconnecting the first and second conductive layers; and in a second photochemical processing step, forming high-density wiring patterns concurrently in the first and second electrically conductive layers.

8. A process according to claim 7 followed by the step of winding the elongated strip into a roll with the printed circuit boards thereon.

9. A process according to claim 7 followed by the steps of forming fold lines transversely of the strip between printed circuit boards, and folding the strip to stack a plurality of the printed circuit boards.

10. A process according to claim 9 followed by the step of bonding a stack of printed circuit boards to a power supply layer to form a substantially rigid body.

11. A printed circuit board comprising
a first, flexible metal clad laminate having a first insulating layer and first and second electrically conductive layers bonded to opposite surfaces of said insulating layer and having a total thickness of less than 500 $\mu m$;
a plurality of through-holes in said first and second electrically conductive layers;
a plurality of openings through said insulating layer at selected locations of said through-holes in said conductive layers;
electrically conductive material extending through said through-holes in said insulating layer electrically interconnecting said first and second conductive layers;
high-density wiring patterns formed in said first and second electrically conductive layers;
a second, flexible laminate comprising a second insulating layer and a third electrically conductive layer bonded to one surface of said second insulating layer and having a thickness of less than 500 $\mu m$;
a plurality of through-holes in said third electrically conductive layer;
a plurality of openings through said second insulating layer at selected locations of said through-holes in said third conductive layer;
electrically conductive material extending through said through-holes in said second insulating layer electrically connecting said third conductive layer with an opposite surface of said second insulating layer; and
means bonding said opposite surface of said second insulating layer to one of said first and second electrically conductive layers so that said electrically conductive material extending through said second insulating layer is in electrical contact with said one of said first and second electrically conductive layers.

12. A printed circuit board according to claim 11 and further comprising
a third, flexible laminate comprising a third insulating layer and a fourth electrically conductive layer bonded to one surface of said third insulating layer and having a thickness of less than 500 $\mu m$;
a plurality of through-holes in said fourth electrically conductive layer;
a plurality of openings through said third insulating layer at selected locations of said through-holes in said fourth conductive layer;
electrically conductive material extending through said through-holes in said third insulating layer electrically connecting said fourth conductive layer with an opposite surface of said third insulating layer; and
means bonding said opposite surface of said third insulating layer to the other of said first and second electrically conductive layers so that said electrically conductive material extending through said third insulating layer is in electrical contact with said other one of said first and second electrically conductive layers.

13. A printed circuit board according to claim 12 and further comprising a substantially rigid support attached to one of said second and third laminates.

* * * * *